United States Patent
Macours

(10) Patent No.: US 9,820,075 B2
(45) Date of Patent: Nov. 14, 2017

(54) SYSTEM AND METHOD FOR STEREO WIDENING

(71) Applicant: NXP B.V., Eindhoven (NL)

(72) Inventor: Christophe Marc Macours, Leuven (BE)

(73) Assignee: NXP B.V., Eindhoven (NL)

(*) Notice: Subject to any disclaimer, the term of this patent is extended or adjusted under 35 U.S.C. 154(b) by 0 days.

(21) Appl. No.: 14/995,261

(22) Filed: Jan. 14, 2016

(65) Prior Publication Data

US 2016/0212560 A1   Jul. 21, 2016

(30) Foreign Application Priority Data

Jan. 21, 2015   (EP) ..................... 15152026

(51) Int. Cl.
| | |
|---|---|
| *H04S 7/00* | (2006.01) |
| *H04R 5/04* | (2006.01) |
| *H04R 29/00* | (2006.01) |
| *H04R 3/00* | (2006.01) |
| *H04M 1/60* | (2006.01) |
| *H03G 7/00* | (2006.01) |
| *H03G 9/02* | (2006.01) |

(52) U.S. Cl.
CPC ............... *H04S 7/30* (2013.01); *H04R 5/04* (2013.01); *H04R 29/001* (2013.01); *H03G 7/002* (2013.01); *H03G 9/025* (2013.01); *H04M 1/6016* (2013.01); *H04R 3/007* (2013.01); *H04R 2499/11* (2013.01)

(58) Field of Classification Search
CPC . H04S 7/30; H04S 1/002; H04S 3/002; H04S 2430/07; H04S 2420/01; H04S 7/307; H04R 5/04; H04R 29/001; H04R 3/007; H04R 2499/11; H03G 9/025; H03G 7/002
USPC .................................................... 381/17, 300
See application file for complete search history.

(56) References Cited

U.S. PATENT DOCUMENTS

| | | | | |
|---|---|---|---|---|
| 9,432,761 | B2* | 8/2016 | Gautama .................. | H03G 3/20 |
| 2012/0099733 | A1 | 4/2012 | Wang et al. | |
| 2014/0254805 | A1* | 9/2014 | Su .......................... | H04R 3/007 |
| | | | | 381/55 |
| 2015/0125010 | A1* | 5/2015 | Yang ........................ | H04R 3/14 |
| | | | | 381/300 |

FOREIGN PATENT DOCUMENTS

| | | | | |
|---|---|---|---|---|
| EP | 2 822 259 A1 | 1/2015 | | |
| EP | 2822259 A1 * | 1/2015 | ............. | H03G 5/005 |

(Continued)

OTHER PUBLICATIONS

Extended European Search Report for application No. 15152026.9 (dated Jul. 1, 2015).

(Continued)

*Primary Examiner* — Melur Ramakrishnaiah

(57) ABSTRACT

The present disclosure relates to a system for and method of stereophonic widening in loudspeakers. The method includes the steps of: monitoring an amplifier state and/or loudspeaker state; generating an effect control signal in response to monitoring the amplifier state and/or a loudspeaker state; applying the effect control signal to an effect processor. The effect processor controls an amount of stereophonic widening based on the effect control signal.

14 Claims, 3 Drawing Sheets

(56) References Cited

FOREIGN PATENT DOCUMENTS

| WO | WO-2013/181172 A1 | 12/2013 | | |
|---|---|---|---|---|
| WO | WO 2013181772 A1 | * | 12/2013 | ............. B65B 13/32 |

OTHER PUBLICATIONS

NXP Semiconductors; "TFA9887 Audio system with adaptive sound maximize and speaker protection, Rev. 1"; Product Short data sheet; retrieved from the internet : URL: http://www.nxp.com/documents/shsort_data_sheet/TFA9987_SDS. pdf on Jun. 22, 2015; 20 pages.

* cited by examiner

SYSTEM AND METHOD FOR STEREO WIDENING

CROSS-REFERENCE TO RELATED APPLICATIONS

This application claims the priority under 35 U.S.C. § 119 of European patent application no. 15152026.9, filed Jan. 21, 2015 the contents of which are incorporated by reference herein.

FIELD

The present disclosure relates to a method for stereophonic widening. The present disclosure also relates to a system for stereophonic widening. The present disclosure also relates to a portable electronic device comprising a system for stereophonic widening.

BACKGROUND

An audio reproduction system may generally be represented by a series arrangement of a signal processor, such as a digital signal processor (DSP), followed by a power amplifier. The power amplifier may be connected to and drive a loudspeaker or in the case of stereo reproduction, a pair of loudspeakers. Such an arrangement is generally known as an audio reproduction chain. The power amplifier and the loudspeakers will have operational limitations related to the specific type of components used. For example the power amplifier may have electrical limitations such as, a maximum operating (or output) levels defined as a maximum peak output voltage or current or a maximum peak gain. The loudspeaker may have mechanical limitations such as, inter alia, a maximum membrane excursion and also thermal limitations such as a maximum voice coil temperature. The maximum output level of a specific amplifier and the maximum excursion of a specific loudspeaker may be known and may thus be used to define maximum safe operating levels of the audio reproduction system.

In audio reproduction systems a term known as headroom refers to the amount by which the signal-handling capabilities of an audio system exceed maximum operating levels. Headroom can be thought of as a safety zone allowing transient audio peaks to exceed maximum operating levels of the system without exceeding for example the maximum excursion level of the loudspeaker or a clip level of the amplifier (defined by the maximum gain of the amplifier).

In mobile devices or portable electronic devices, such as for example smart phones, tablets or the like, the operational limitations (be that mechanical or electrical) may be limited by the use of miniature components which would be required to fit within the device housing. The requirement of miniaturisation will be particularly apparent for loudspeakers, where membrane excursions will be limited by the size of the loudspeaker that can be accommodated within the device housing. In addition because such devices are generally powered by battery they may have power consumption limitations whereby any component, in particular any power amplifying component may be required to operate at low power typically 0.5 Watts per channel. Therefore, for mobile devices or portable electronic devices the issues concerning mechanical limitations and electrical limitations of the components will be particularly apparent. Amplifiers are available with the ability to maximize the audio output in terms of sound pressure level or low frequency response for a maximum electrical limitation of the amplifier itself or for a mechanical or thermal limitation of the loudspeaker it drives. Such amplifiers are known as smart amplifiers.

Increasingly mobile devices or portable electronic devices are being equipped with one or more pairs of loudspeakers thereby, in theory, allowing stereo audio reproduction. The loudspeakers will typically be located in close proximity to each other, as determined by the size of the mobile device in question. In practice however, the perceptible stereo image will be narrow or even non-existent. Stereo widening techniques may improve spatial sound reproduction, and therefore an improved stereo image, on speakers located close to each other.

Known techniques for stereo widening include techniques, such as spatial effect techniques, may rely on acoustic cross-talk cancellation. So-called transaural audio systems of the type illustrated in FIG. 1a are one of many popular methods of acoustic cross-talk cancellation. With reference to FIG. 1a, an example transaural audio system 10 may utilise a cross-talk canceller 12 in the audio reproduction chain. The cross-talk canceller 12 comprises left L and right R input channels and left and right output channels connected to respective left and right channel power amplifiers 13 followed by left and right channel loudspeakers 14. Such, transaural audio systems aim to, at least partially, cancel the acoustic cross-talk (indicated by dotted lines) between each loudspeaker and the opposite ear of a listener 15. The cross-talk canceller 12 may be implemented, for example, by the architecture shown in FIG. 1b which comprises an arrangement of filters A, B, C, D.

However, such transaural audio systems are known to be ill-conditioned because the difference between the direct path head related transfer function (HRTF) (indicated in FIG. 1a by the solid lines from the left and right side loudspeakers to the respective left and right side ears of listener 15) and the cross-talk path HRTF is very small at low frequencies, resulting in large gains in the cross-talk canceller filters low frequency response. This problem is particularly apparent when the two loudspeakers are positioned close together, such as in the case of a portable electronic or mobile device, because the distance between cross-talk paths will be small. The smaller the distance between loudspeakers the larger the required low frequency signal boost. Techniques which rely on signal boosting can result in saturation of the output signal or mechanical overdrive of the speakers.

To overcome problems of saturation the signal level must be scaled down or dynamically compressed. However scaling or compression can ultimately reduce sound pressure levels from the loudspeakers and have a negative effect on audio quality, due to for example dynamic compression artifacts. Furthermore, the amount of boost is frequency dependent, in that the signal will generally boosted more in the low frequency range than the high frequency range. Even when the stereo widening level does not saturate, it can lead to excessive loudspeaker excursion, also known as mechanical overdrive, beyond safe operating mechanical limits which can introduce audible distortions and potentially damage the membrane of the speaker.

SUMMARY

An embodiment relates to a method of stereophonic widening in loudspeakers, the method comprising: monitoring an amplifier state and/or loudspeaker state; generating an effect control signal in response to monitoring the amplifier state and/or a loudspeaker state; applying the effect control signal to an effect processor, whereby the effect processor controls an amount of stereophonic widening based on the effect control signal.

An amplifier comprising a processor may monitor the amplifier state and/or the loudspeaker state.

The effect control signal may comprise a plurality of control signals. At least one of the plurality of control signals may control an amplifier state and at least another of the plurality of control signals may control a loudspeaker state. The amplifier state may comprise a gain of the amplifier and the loudspeaker states may comprise an excursion of the loudspeaker. The amplifier state may indicate an amount of signal level headroom and the loudspeaker states may indicate an amount of excursion headroom. The effect control signal may be applied to a spatial effect processor. The spatial effect processor may be a cross-talk canceller.

An embodiment relates to a system for stereophonic widening in loudspeakers, the system comprising: a monitor arranged to monitor an amplifier state and/or a loudspeaker state; a controller arranged to generate a control signal in response to monitoring an amplifier state and/or loudspeaker state; and an effect processor arranged to control the an amount of stereophonic widening based on the effect control signal.

The amplifier may be arranged to monitor the amplifier state and/or the loudspeaker state. The amplifier state may be the gain of the amplifier and the loudspeaker state may be an excursion of the loudspeaker.

The effect control signal may comprise a plurality of control signals. At least one of the plurality of control signals is arranged to control an amplifier state and at least another of the plurality of control signals controls a loudspeaker state, and a first of the plurality control signals controls the amount of high frequency stereo widening and the second of the plurality of control signals controls the amount of low frequency stereo widening.

DESCRIPTION OF THE DRAWINGS

In the figures and description like reference numerals refer to like features. One or more embodiments are described by way of example only with reference to the accompanying drawings in which.

Figure 2:
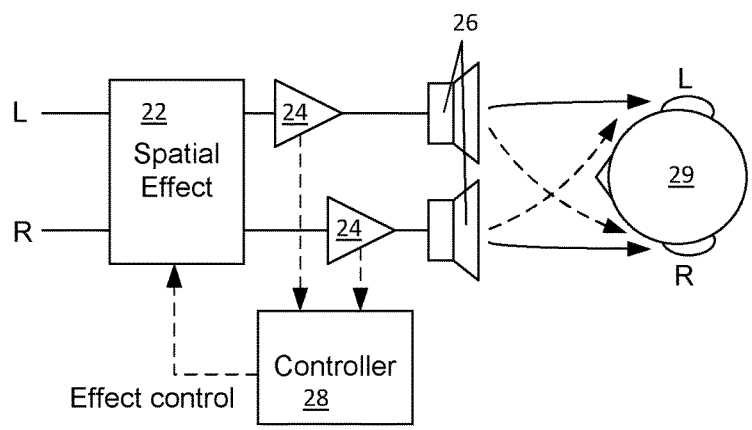
FIG. 2 illustrates a block diagram of a stereo widening system according to an embodiment.
Figure 5:
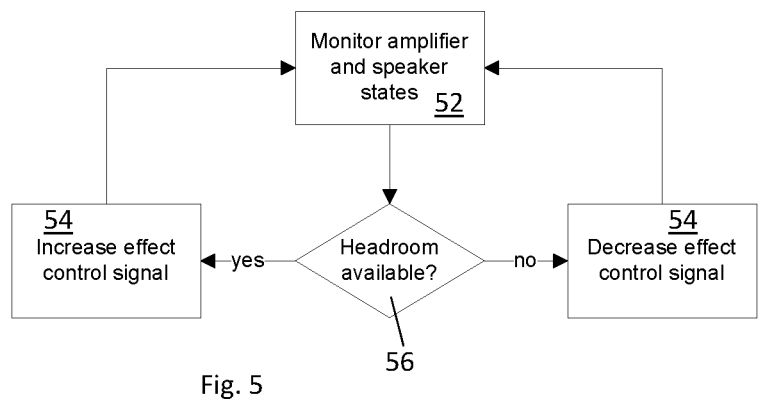
FIG. 5 illustrates a flow diagram of a method of stereo widening.

In overview and with reference to the block diagram of FIG. 2 and the flow diagram of FIG. 5, a stereo widening system 20 functionality and associated method are described. The stereo widening system 20 may comprise a spatial effect processor 22. The spatial effect processor 22 may comprise inputs for respective left, L and right R side audio channels. Respective left L and right R side audio output channels of the stereo widening system 20 may comprise respective audio amplifiers 24, for amplifying left side and right side audio signals outputted from the spatial effect processor 22. Amplified left and right side audio signals may drive corresponding left side and right side loudspeakers 26. One or both of the audio amplifiers 24 may be so-called "smart amplifiers", such as NXP's TFA9887. Such amplifiers may have the functionality to monitor one or more audio states or parameters of the amplifier and/or the loudspeakers and provide an indication of those states or parameters to a controller 28.

Smart amplifiers may provide the functionality to amplify audio signals to drive loudspeakers. Various parameters relating to the input and output of the amplifier may also be analysed such that the characteristics and/or diagnostics of a loudspeaker driven by the smart amplifier may be derived. These characteristics and/or diagnostics are then presented as outputs, so that different functions, for example stereo widening as discussed here, may make use of the characteristics and/or diagnostics for audio signal processing.

Based on continuously or periodic monitored audio states or parameters from the amplifiers 24 and/or the speakers, the controller 28 may generate one or more control signals which may control the amount of stereo widening applied to the respective left and right side audio signals by the spatial effect processor 22. The spatial effect processor 22 may for example implement spatial effect algorithms, such as a stereo widening, which may be based on a transaural audio system, such as the type discussed below with respect to FIG. 3 or 4. Transaural audio systems aim to, at least partially, cancel the acoustical crosstalk 27 (indicated by dotted lines) between each of the left and right side loudspeakers 26 and the respective opposite ear of a listener 29. As a result, it is possible to feed each ear of a listener 29 with a signal (Left, L or Right, R) that contains spatial cues corresponding to sound sources which may be perceived by the listener 29 to be located outside the actual physical positions of the loudspeakers 26. Example implementations for a spatial effect processor 22 may include the type discussed below in relation to FIG. 3.

The spatial effect processor 22 receives left L and right R input audio signals from an audio source (not illustrated). The amplifiers 24 receive the input audio signals from the spatial effect processor 22 and provide output signals to respective left and right side loudspeakers 26. As discussed, the amplifiers 24 may be so-called smart amplifiers in that they may have the ability to monitor their own state and/or the state of the loudspeakers 26 coupled to the respective amplifiers 24. For example, each of the amplifiers 24 may be arranged to monitor its own gain, such that each of the amplifiers may adjust its gain to prevent clipping (or saturation) of the amplified audio signal. In addition the amplifiers 24 may have the ability monitor the excursion of their respective loudspeakers 26 such that the loudspeaker 26 is not driven with an amplified audio signal that will cause mechanical overdrive of the loudspeaker 26. In this regard the ability of the amplifiers 24 to carry out monitoring may incorporate processor functionality (not illustrated) for carrying out the monitoring (step 52 of FIG. 5). The amplifier and processor function may be implemented separately or combined on a single chip, DSP or host audio processor.

The controller 28 then generates a control signal, also called an effect control signal (step 54 of FIG. 5) based on the monitored states of the respective Left and/or Right channel amplifiers 24 and the respective Left and/or Right channel loudspeakers 26. The generated control signal may control the amount of spatial effect, or in other words the amount stereo widening, to be applied to the input audio signal by the spatial effect processor 22.

Considering now the case where the amplifiers monitor the excursion of the loudspeaker, the amplifiers 24 may provide the controller 28 with an indication of the amount of excursion that the respective loudspeakers 26 are currently undergoing. Based on a maximum allowable excursion distance limit of the loudspeakers 26 (typically a predefined limit defined by the loudspeaker manufacturer) and the current excursion distance of the loudspeaker, the controller 28 calculates the amount of so-called headroom available in the form of a loudspeaker excursion (step 56 of FIG. 5). This calculation is the difference between the maximum allowable excursion for any particular loudspeaker, as typically defined by the manufacturer, and the current excursion that the loudspeaker is undergoing.

Similarly, considering the case of the audio signal, the processor associated with the respective amplifiers 24 may provide the controller with an indication of current signal level. Based on the maximum signal saturation level or clipping level of the amplifiers 24, as typically defined by the manufacturer, and the current signal level, the controller may calculate the amount of headroom available in the signal level. This calculation is the difference between the maximum signal saturation level and the current signal level.

Based on the calculated signal level headroom and/or the calculated excursion headroom, the controller 28 generates a control signal, such as a spatial effect control signal based on transaural audio techniques. The spatial effect control signal controls the amount of stereo widening as discussed further below with respect to FIG. 3. In the context of audio signal reproduction, headroom can be thought of as the amount of available parameter (for example excursion or signal level) before maximum safe operating levels of a particular parameter are exceeded. In this regard, the amount of stereo widening can be viewed as function of the available headroom, and in this regard the effect control signal may be increased (step 57 of FIG. 5) or decreased (step 58 of FIG. 5) as function of the available headroom. The amount of stereo widening is generated as follows.

The controller 28 may be implemented to monitor if one or more of the audio amplifiers 24 limits or one or more of the loudspeaker 26 limits (as discussed above) is reached or exceeded and calculate the available headroom. If one or more of those limits is reached (that is there is available headroom) the effect control signal is reduced, so as to reduce the amount of stereo widening. Otherwise, if none of the limits are reached the effect control signal is increased until the amplifier limits and/or loudspeaker are reached. By monitoring the amplifier and/or loudspeaker state with respect to their respective predefined operational limits the controller 28 may generate the necessary control signal based on available headroom to ensure that the maximum available spatial effects are applied to the respective left and right side audio signals. In this way the amount of stereo widening is adapted based on available headroom.

The effect control signal may be a single value ranging from a minimum (for example 0.00), through intermediate values (for example 0.25), up to a maximum (for example 1.00). In the case where the effect control signal is a minimum, no stereo widening will be applied since there will be no available headroom. Conversely, in the case where the effect control signal is a maximum, a maximum amount of stereo widening will be applied.

The effect control signal may alternatively comprise a plurality of effect control signals where each signal may be a value ranging from minimum (for example 0.00) up to a maximum (for example 1.00). In this way for example, each one of the plurality of effect control signals may control the amount of widening at a specific frequency band. That is, one of the plurality of effect control signals may control the amount of low frequency stereo widening which may mostly affect the amount of speaker excursion. Whereas the other one of the plurality may control the amount of high frequency stereo widening which may only affect the amount of output signal level. This makes it possible to maintain a high amount of effect at high frequencies while temporarily reducing the effect at low frequencies. In the context of the present discussion high frequency may be considered as any frequency above the resonant frequency of the loudspeakers, whereas low frequency may be considered as any frequency below the resonant frequency of the loudspeakers. Controlling of the amount of stereo widening at low frequencies may prevent over excursion of the speaker and thus prevent mechanical damage to the speaker. Controlling the amount of stereo widening at high frequencies may prevent clipping effects in the amplifiers 24.

With respect to the speakers, the amount of excursion may be higher for frequencies below the speaker resonance frequency, therefore the excursion limit is typically reached earlier than the amplifier clipping limit. For portable electronic devices such as mobile phones or smart phones the resonant frequency is dependent on the form factor of the device, which ultimately limits the speaker size. Typically the resonant frequency may in the range of 500 Hz to 1 kHz.

Figure 1A:
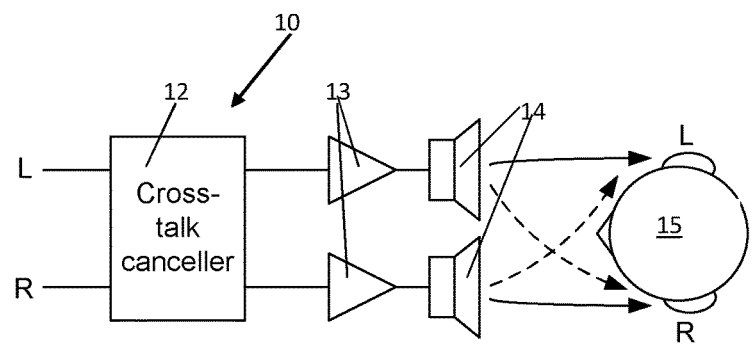
FIG. 1a shows a generalised audio reproduction chain for a known transaural audio system.
Figure 1B:
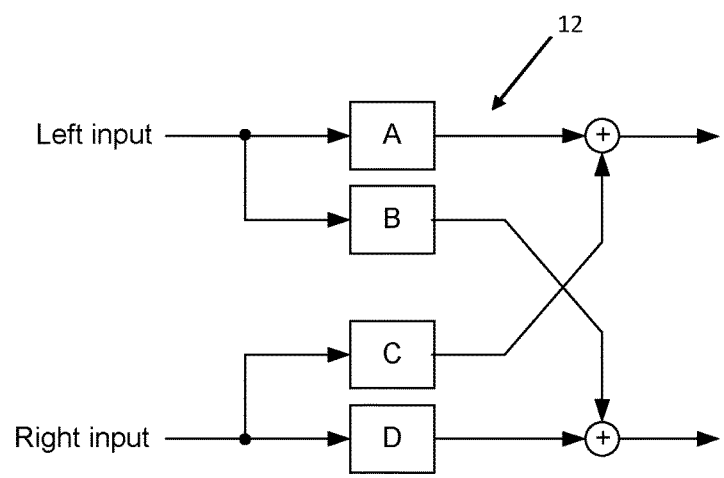
FIG. 1b shows an architecture for a known cross-talk canceller architecture.
Figure 3:
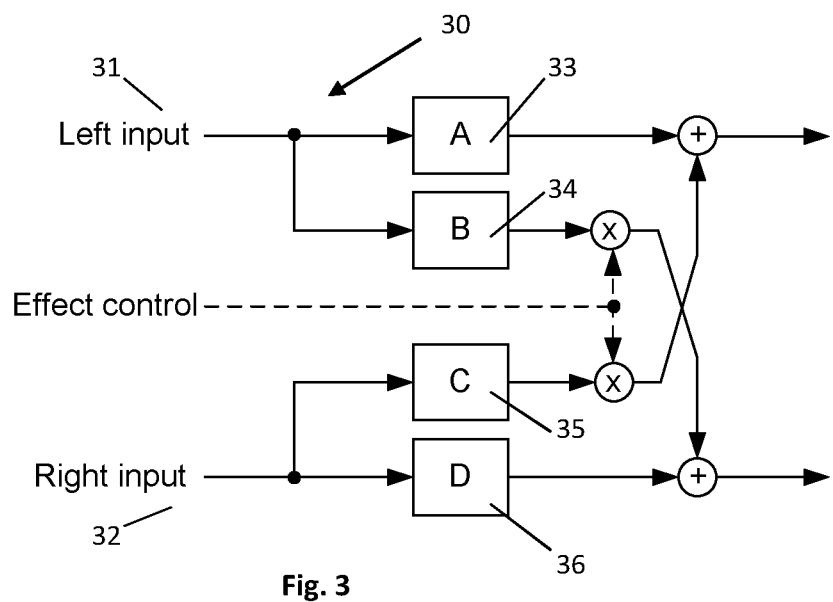
FIG. 3 illustrates a cross-talk canceller with an effect control input.

In an embodiment the effect control signal may be applied to control a cross-talk canceller type spatial effect processor as illustrated in FIG. 3. The spatial effect processor may be a cross-talk canceller 30 of the type discussed in FIG. 1*b* above. As previously mentioned the system may be considered a transaural audio system which aims to at least partially cancel the acoustical crosstalk between loudspeakers and the opposite ear of a listener. As a result, it is possible to feed each ear of a user, for example as illustrated in FIG. 2, with a signal (Left, L or Right, R) that contains spatial cues corresponding to sound sources which will be perceived by the listener to be located outside the actual physical positions of the loudspeakers.

The cross-talk canceller comprises left 31 and right 32 audio input channels. The left audio input channel 31 is filtered by a first left filter 33. The output of the first left filter 33 is summed with the right audio input channel 32 which is filtered by a second right filter 35. Similarly, the right audio input channel 32 is filtered by a first right filter 36. The output of the first right filter 36 is summed with the left audio input channel which is filtered by a second left filter 34. The properties of the respective filters are entirely at the choice of the skilled person. Also the skilled person will appreciate that the respective Left, L and Right, R side channel summed outputs of the cross-talk canceller 30 are connected to the respective Left and Right channel amplifiers 24 for example as shown in the arrangement of FIG. 2.

As illustrated in FIG. 3 the cross-talk path may be scaled by the effect control signal by applying as a product function to the respective left and right channels cross talk paths. The effect control signal may be a variable gain factor. In this way, the cross talk path is scaled is a function of the amount speaker excursion headroom and/or amount of headroom available in the signal level.

Figure 4:
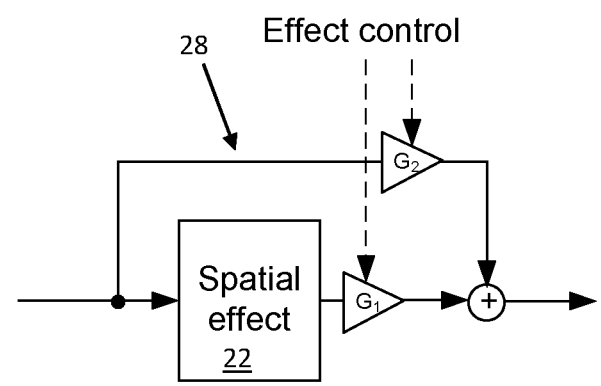
FIG. 4 illustrates a cross fade canceller with effect control input.

As illustrated in FIG. 4, the controller 28 may be implemented as a crossfade arrangement. The cross fade is applied between the input and the output of the spatial effect processor 22. The effect control values are applied to gains $G_1$ and $G_2$ such that $G_1=\alpha$ and $G_2=1-\alpha$, where $\alpha$ is the effect control signal. The skilled person will recognise that whilst FIG. 4, illustrates a single channel, a two channel, stereo, or multi-channel arrangement may be implemented by repeating this arrangement for each required channel.

The skilled person will recognise that the above discussion of effect control may be applied in different ways for example by changing the settings, for the example loud speaker and amplifier states of the spatial effect processor.

The systems and methods as described herein may be implemented on a digital signal processor (DSP) by an appropriate algorithm, as understood by those skilled in the art. For example the spatial effect processor 22 may be implemented on the audio amplifier DSP. Alternatively, the spatial effect processor, could be implemented in an amplifier or processor chip, such as a host processor chip. The functionality as described herein may also be implemented by appropriate algorithms in software.

Alternatively the systems and methods may be implemented in the analogue domain.

Embodiments as described herein implement a continuous or periodic monitoring by the audio amplifiers 24. In an alternative embodiment the audio amplifiers 24 could activate a trigger, such as for example a flag, when one or more threshold or limits is reached. The controller may then adapt the amount of stereo widening, that is, the effect control, in such a way that none of the audio amplifiers 24 and loudspeakers 26 limits is exceeded.

Particular and preferred aspects of the invention are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed invention or mitigate against any or all of the problems addressed by the present invention. The applicant hereby gives notice that new claims may be formulated to such features during prosecution of this application or of any such further application derived there from. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

Term "comprising" does not exclude other elements or steps, the term "a" or "an" does not exclude a plurality. Reference signs in the claims shall not be construed as limiting the scope of the claims.

The invention claimed is:

1. A method of stereophonic widening, the method comprising:
   monitoring an amplifier state and a loudspeaker state of both a first loudspeaker and a second loudspeaker;
   wherein the amplifier states indicate an amount of signal level headroom for both loudspeakers and the loudspeaker states indicate an amount of excursion headroom for both loudspeakers;
   generating an effect control signal in response to monitoring the amplifier states and the loudspeaker states;
   applying the effect control signal to an effect processor, whereby the effect processor controls an amount of stereophonic widening based on the effect control signal.

2. The method of claim 1 wherein an amplifier comprising a processor monitors the amplifier states and the loudspeaker states.

3. The method of claim 1 wherein the effect control signal comprises a plurality of control signals.

4. The method of claim 3 wherein at least one of the plurality of control signals controls the amplifier states and at least another of the plurality of control signals controls the loudspeaker states.

5. The method of claim 4 wherein at least one of the plurality control signals controls an amount of high frequency stereo widening and at least another of the plurality of control signals controls an amount of low frequency stereo widening for both loudspeakers.

6. The method of claim 1 wherein the amplifier states include a gain of the amplifiers and the loudspeaker states include an excursion of the loudspeakers.

7. The method of claim 1 wherein the effect control signal is applied to a spatial effect processor.

8. The method of claim 7, wherein the spatial effect processor is a cross-talk canceller.

9. A system for stereophonic widening, the system comprising:
   a monitor arranged to monitor an amplifier state and a loudspeaker state of both a first loudspeaker and a second loudspeaker;
   wherein the amplifier states indicate an amount of signal level headroom for both loudspeakers and the loudspeaker states indicate an amount of excursion headroom for both loudspeakers;
   a controller arranged to generate a control signal in response to monitoring the amplifier states and loudspeaker states; and
   an effect processor arranged to control an amount of stereophonic widening based on an effect control signal.

10. The system of claim 9 wherein an amplifier is arranged to monitor the amplifier states and/or the loudspeaker states.

11. The system of claim 10, wherein the amplifier states include a gain of the amplifiers and the loudspeaker states include an excursion of the loudspeakers.

12. The system of claim 9 wherein the effect control signal comprises a plurality of control signals.

13. The system of claim 12 wherein:
   at least one of the plurality of control signals is arranged to control the amplifier states and at least another of the plurality of control signals controls the loudspeaker states, and
   a first of the plurality control signals controls an amount of high frequency stereo widening and the second of the plurality of control signals controls an amount of low frequency stereo widening for both loudspeakers.

14. A portable electronic device comprising the system of claim 9.

* * * * *